United States Patent
Farrell et al.

(10) Patent No.: US 6,965,540 B2
(45) Date of Patent: *Nov. 15, 2005

(54) MEMORY DEVICE OPERABLE IN EITHER A HIGH-POWER, FULL-PAGE SIZE MODE OR A LOW-POWER, REDUCED-PAGE SIZE MODE

(75) Inventors: Todd D. Farrell, Boise, ID (US); Scott E. Schaefer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/851,879

(22) Filed: May 20, 2004

(65) Prior Publication Data

US 2004/0213036 A1 Oct. 28, 2004

Related U.S. Application Data

(63) Continuation of application No. 10/039,815, filed on Oct. 26, 2001, now Pat. No. 6,751,159.

(51) Int. Cl.⁷ ............................................. G11C 8/00
(52) U.S. Cl. ...................... 365/238.5; 365/230.02; 365/230.03; 365/185.12
(58) Field of Search ................. 365/238.5, 230.02, 365/230.03, 230.05, 185

(56) References Cited

U.S. PATENT DOCUMENTS

| | | | |
|---|---|---|---|
| 4,661,929 A | 4/1987 | Aoki et al. ................. 365/189 |
| 4,961,167 A | 10/1990 | Kumanoya et al. .... 365/189.09 |
| 5,134,699 A | 7/1992 | Aria et al. ................... 395/425 |
| 5,148,546 A | 9/1992 | Blodgett ..................... 713/320 |
| 5,229,647 A | 7/1993 | Gnadinger ................... 257/785 |
| 5,321,662 A | 6/1994 | Ogawa ........................ 365/191 |
| 5,381,368 A | 1/1995 | Morgan et al. ......... 365/189.01 |
| 5,414,861 A | 5/1995 | Horning ....................... 395/750 |
| 5,475,645 A | 12/1995 | Wada .......................... 365/222 |
| 5,630,091 A | 5/1997 | Lin et al. ..................... 395/437 |
| 5,712,795 A | 1/1998 | Layman et al. ............. 364/472 |
| 5,729,497 A | 3/1998 | Pawlowski ................... 365/200 |
| 5,764,562 A | 6/1998 | Hamamoto ................. 365/149 |
| 5,781,483 A | 7/1998 | Shore .......................... 365/200 |
| 5,828,619 A | 10/1998 | Hirano et al. ............... 365/222 |
| 5,953,266 A | 9/1999 | Shore .......................... 365/200 |
| 5,963,473 A | 10/1999 | Norman .................. 365/185.02 |
| 5,966,334 A | 10/1999 | Shore .......................... 365/200 |
| 5,966,736 A | 10/1999 | Gittinger et al. ............ 711/207 |
| 5,974,573 A | 10/1999 | Martin ......................... 714/48 |

(Continued)

FOREIGN PATENT DOCUMENTS

WO   96/28225   9/1996

OTHER PUBLICATIONS

Stallings, William, "*Computer Organization & Architecture: Designing for Performance,*" pp. 103–116.

*Primary Examiner*—Anh Phung
*Assistant Examiner*—Toan Le
(74) *Attorney, Agent, or Firm*—Dorsey & Whitney LLP

(57) ABSTRACT

A memory device includes 4 memory banks each of which includes first and second arrays of memory cells. A mode register is programmed with a bit that selects a high-power, large-page operating mode or a low-power, small-page operating mode. In the high-power mode, a row decoder is coupled to the row lines in both the first and second arrays. In the low-power mode, the row decoder is coupled to the row lines in only one of the arrays as determined by the state of an array select signal. The array select signal corresponds to the most significant bit of the column address, but it is applied to the memory device at the time the row address is applied to the memory device. Sense amplifiers coupled to the first and second arrays may also be selectively enabled when the row lines for the corresponding array are coupled to the row decoder.

32 Claims, 4 Drawing Sheets

U.S. PATENT DOCUMENTS

| | | | |
|---|---|---|---|
| 5,978,952 A | 11/1999 | Hayek et al. | 714/764 |
| 5,982,697 A | 11/1999 | Williams et al. | 365/230.03 |
| 6,023,432 A | 2/2000 | Shore | 365/200 |
| 6,044,029 A | 3/2000 | Shore | 365/200 |
| 6,049,500 A | 4/2000 | Kajigaya et al. | 365/230.02 |
| 6,101,614 A | 8/2000 | Gonzales et al. | 714/6 |
| 6,104,641 A | 8/2000 | Itou | 365/149 |
| 6,134,167 A | 10/2000 | Atkinson | 365/222 |
| 6,154,851 A | 11/2000 | Sher et al. | 714/5 |
| 6,154,860 A | 11/2000 | Wright et al. | 714/718 |
| 6,191,995 B1 | 2/2001 | Huber et al. | 365/230.01 |
| 6,195,717 B1 | 2/2001 | Henderson et al. | 710/101 |
| 6,216,246 B1 | 4/2001 | Shau | 714/763 |
| 6,246,619 B1 | 6/2001 | Ematrudo et al. | 365/201 |
| 6,343,045 B2 | 1/2002 | Shau | 365/227 |
| 6,356,500 B1 | 3/2002 | Cloud et al. | 365/226 |
| 6,381,707 B1 | 4/2002 | Larsen et al. | 714/8 |
| 6,414,894 B2 | 7/2002 | Ooishi et al. | 365/222 |
| 6,426,908 B1 | 7/2002 | Hidaka | 365/222 |
| 6,438,057 B1 | 8/2002 | Ruckerbauer | 365/222 |
| 6,438,068 B1 | 8/2002 | Roohparvar | 365/238.5 |
| 6,449,203 B1 | 9/2002 | Cowles et al. | 365/222 |
| 6,452,859 B1 | 9/2002 | Shimano et al. | 365/230.06 |
| 6,510,528 B1 | 1/2003 | Freeman et al. | 714/6 |
| 6,519,201 B2 | 2/2003 | Cowles et al. | 365/222 |
| 6,528,974 B1 | 3/2003 | Mirov et al. | 323/267 |
| 6,532,180 B2 | 3/2003 | Ryan et al. | 365/195 |
| 6,549,476 B2 | 4/2003 | Pinney | 365/190 |
| 6,549,479 B2 | 4/2003 | Blodgett | 365/222 |
| 6,556,497 B2 | 4/2003 | Cowles et al. | 365/222 |
| 6,580,149 B2 | 6/2003 | Tran et al. | 257/549 |
| 6,608,476 B1 | 8/2003 | Mirov et al. | 324/103 |
| 6,751,159 B2 * | 6/2004 | Farrell et al. | 365/238.5 |
| 2002/0126558 A1 | 9/2002 | Cowles et al. | 365/222 |
| 2002/0126559 A1 | 9/2002 | Cowles et al. | 365/222 |
| 2002/0162076 A1 | 10/2002 | Talagala et al. | 714/819 |
| 2003/0067830 A1 | 4/2003 | Leung et al. | 365/222 |
| 2003/0081492 A1 | 5/2003 | Farrell et al. | 365/238.5 |
| 2003/0097608 A1 | 5/2003 | Rodeheffer et al. | 714/7 |

* cited by examiner

MEMORY DEVICE OPERABLE IN EITHER A HIGH-POWER, FULL-PAGE SIZE MODE OR A LOW-POWER, REDUCED-PAGE SIZE MODE

CROSS-REFERENCE TO RELATED APPLICATION

This application is a continuation of pending U.S. patent application Ser. No. 10/039,815, filed Oct. 26, 2001 now U.S. Pat. No. 6,751,159.

TECHNICAL FIELD

The invention relates memory devices, and more particularly to a dynamic random access memory device that can operate in either a normal or a reduced power mode.

BACKGROUND OF THE INVENTION

Dynamic random access memory ("DRAM") devices are commonly used in a wide variety of applications. One of the most common use for DRAM devices is as system memory in personal computers. The speed and capacity demands on DRAM devices continues to increase in this and other applications. However, the power consumed by DRAM devices increases with both the capacity and the operating speed of the devices. For many application, it is important to limit the power consumption of DRAM devices. For example, DRAM devices used as system memory in portable personal computers should consume relatively little power to allow a battery to power the computer over an extended period. Thus, the demands for ever increasing memory capacities and speeds are inconsistent with the demands for ever decreasing memory power consumption.

Another challenge encountered in designing DRAM devices is the need to make them usable in a wide variety of applications. It is often more desirable to adapt a single DRAM design to several applications rather than design a different DRAM for each application. This challenge can be particularly difficult when the capacity demands for DRAM devices constantly changes. It is important that a single DRAM device be usable not in state of the art applications, but also that it be "backward compatible" so it can continue to be used in more conventional applications.

The difficulties in meeting all of these design challenges is exemplified by a conventional DRAM 10, a portion of which is shown in FIG. 1. The DRAM 10 includes 4 memory banks 12a,b,c,d, each of which includes two arrays 16, 18, although some DRAMs use a lesser or greater number of memory banks with a lesser or greater number of arrays or sub-arrays in each memory bank. A single memory bank 12a,b,c,d is selected for a memory access by the output of a bank decoder 14, which receives a 2-bit bank address $BA_0$–$BA_1$. As is well known in the art, each array 16, 18 includes a large number of memory cells (not shown) arranged in rows and columns. An individual row is selected by activating a respective one of several row lines, collectively referred to by reference number 20, and a data bit in a selected column is read from a memory cell in the selected row and the selected column. The row lines 20 are activated by a row decoder 30, which receives a row address, typically from a memory controller (not shown). The column lines are selected by column decoders and sense amplifiers 34, which receive a column address, also typically from a memory controller. However, the row address and/or the column address may be generated from other sources. For example, the row addresses may be generated internally in the DRAM 10 for the purpose of refreshing the memory cells, as is well known in the art. The column addresses may also be generated internally in the DRAM 10 for the purpose of, for example, sequentially accessing columns of memory cells in a "burst" access mode.

Regardless of how the row and column addresses are generated, when each row line 20 is activated, it couples bits of data from respective memory cells in respective columns of the row of memory cells corresponding to the activated row line. A sense amplifier 34 for each column then senses the level of the data bit. Whenever a row line is activated, the sense amplifiers 34 sense the level of respective data bits in respective columns in both arrays 16, 18. When the sense amplifiers 34 are sensing data bit levels, they consume a substantial amount of power. The amount of power consumed is proportional to both the number of columns in the arrays 16, 18 and the rate at which the sense amplifiers 34 are sensing data bit levels. Thus, the power consumption of the DRAM 10 tends to increases with both higher capacity, i.e., a larger number of columns, and higher speed.

As the number of columns in the arrays 16, 18 increases, the number of data bits in each row, known as a "page," can increase beyond the number of data bits needed for a read or a write operation. For example, the DRAM 10 receives 13 row address bits ($A_0$–$A_{12}$) and 12 column address bits ($A_0$–$A_9$, $A_{11}$, $A_{12}$), to access 8K rows and 4K columns. Thus, each time a row is activated, 4K bits of data may be accessed in the "open" page, even though respective column addresses may select relatively few bits of data to be read from the arrays 16, 18. In fact, $A_{11}$, the second highest order column address bit, will generally select either the 2K columns in the array 16 or the 2K columns in the array 18. Thus, a substantial amount of power is consumed by making data bits available from columns that will not be accessed.

In the past, the DRAM 10 has been manufactured for either a high-power application having a full page size or for a low-power application having a smaller page size. This has been done during fabrication by altering the topography of the DRAM 10 using mask options or some other alterable conductive component. For high-power applications having a full page size, each row line 20 is fabricated to extend through both of the arrays 16, 18, and the DRAM 10 is fabricated to receive 12 column address bits, $A_0$–$A_9$, $A_{11}$, $A_{12}$ to select each of the 4K columns in both of the arrays. For low-power applications having a reduced page size, one set of row lines is fabricated to extend through one of the arrays 16, and another set of row lines is fabricated to extend through the other of the array 18. One of the two sets of row lines 20 is selected by an additional row address bit, which is actually used at the most significant bit of a column address. However, since the columns in only one of the arrays needs to be selected, one less column address bit is required. Thus, in the high-power, full page size configuration, there are N row address bits and M column address bits. In the low-power, reduced page size configuration, there are N+1 row address bits and M−1 column address bits.

The approach described above provides some design efficiencies for the DRAM manufacturer since virtually the same design can be used for two different products. However, this approach essentially requires the DRAM 10 to be fabricated and sold as two different products, and it prevents a customer purchasing the DRAM 10 from selecting between the competing capabilities of these products after purchase. Moreover, the DRAM 10 configured for high-power and a full page size is not backward compatible in the sense that it can be used in low-power applications.

The DRAM 10 configured for high-power and a full page size is not backward compatible for low-power, reduced page size applications because the number of row and column address bits would be incompatible.

There is therefore a need for DRAM and method of using same that allows the DRAM to be configured by a user for either high-power, full page size operation or low-power, reduced page size operation with the need for extra row address bits.

SUMMARY OF THE INVENTION

A memory device includes an array selecting system that selectively couples row activate signals to either or both of two memory cell arrays without causing significant time penalties. A mode select circuit is programmed to generate a mode select signal that is indicative of operation in either a first or a second mode. The array selecting system receives the mode select signal and an array select signal, which corresponds to a most significant bit of a column address. However, the array select signal is applied to the memory device before the column address is applied, such as at the same time a row address is applied to the memory device. If the mode select signal indicates operation in the first mode, the array select circuit allows the row activate signal to be applied to a row line in both the first and second arrays. If the mode select signal indicates operation in the second mode, the array select circuit allows the row activate signal to be applied to a row line in only one of the arrays depending upon the state of the array select signal. A column control circuit receiving the mode select signal and the array select signal may also selectively de-power sense amplifiers coupled to one of the arrays that is not receiving a row activate signal.

DETAILED DESCRIPTION OF THE INVENTION

Figure 1:
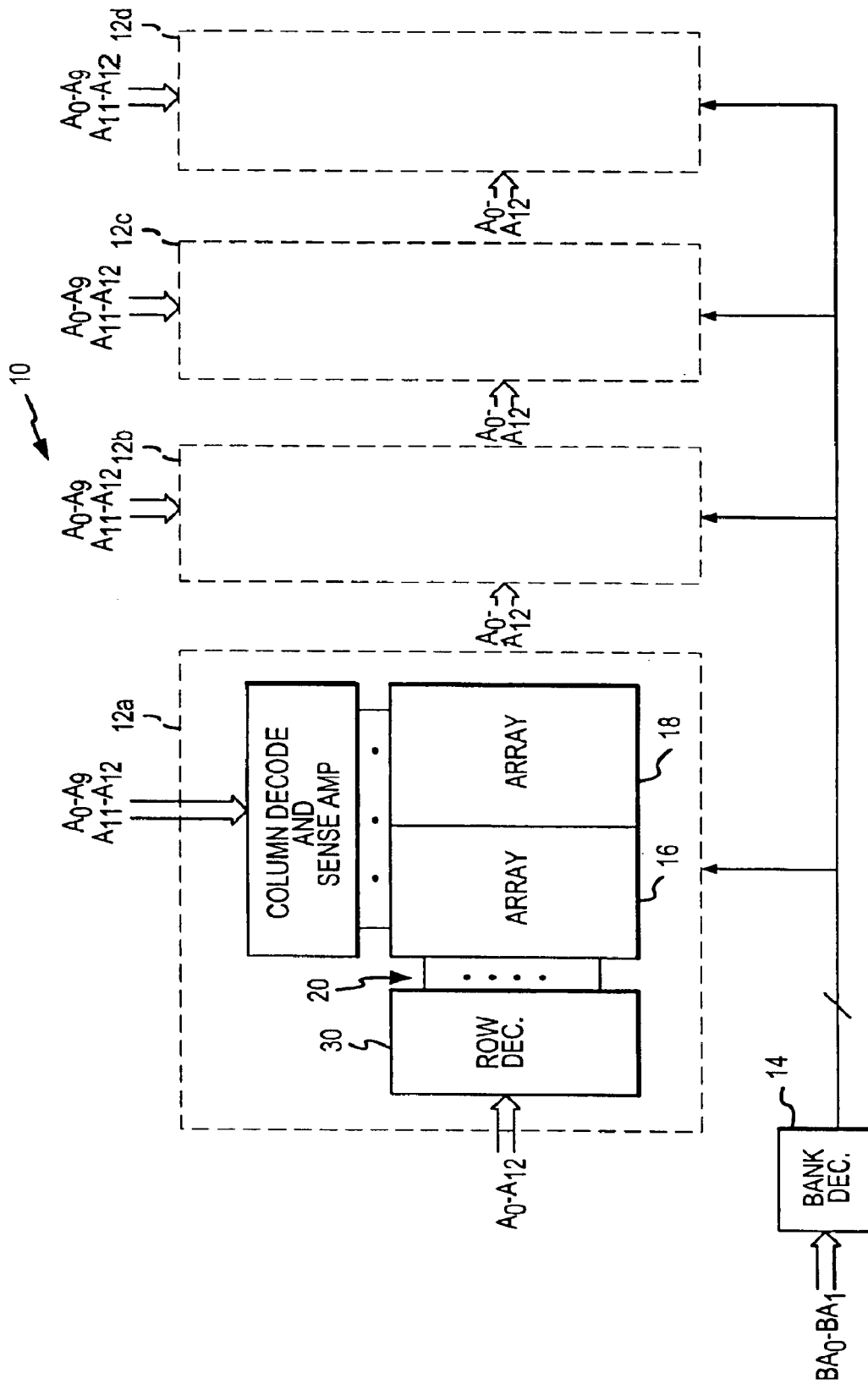
FIG. 1 is a block diagram of a portion of a conventional DRAM capable of being configured during fabrication in either of two topographies.
Figure 2:
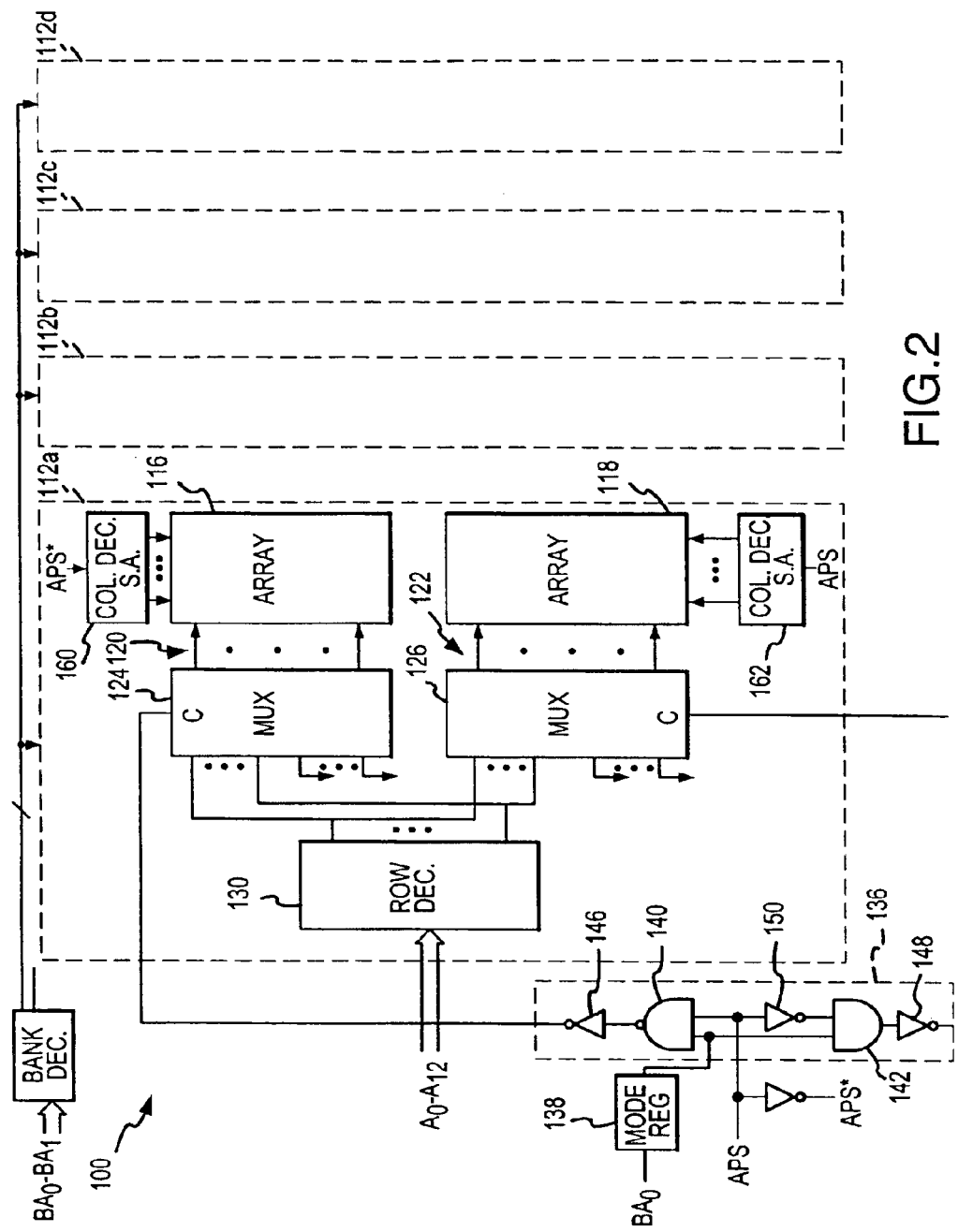
FIG. 2 is a block diagram of a portion of a DRAM according to one embodiment of the invention.

A portion of a DRAM 100 according to one embodiment of the invention is shown in FIG. 2. The DRAM 100 is somewhat similar to the DRAM 10 shown in FIG. 1. The DRAM 100 includes 4 memory banks 112a,b,c,d, each of which includes 2 arrays 116, 118. An individual row in each of the arrays 116, 118 is selected by activating a respective row line. However, the row lines in the DRAM 100 do not extend through both of the arrays 116, 118. Instead, a first set of row lines 120 extend through the first array 116, and a second set of row lines 122 extend through the second array 118. The row lines 120 are coupled to respective output terminals of a first multiplexer 124, and the row lines 122 are coupled to respective output terminals of a second multiplexer 126. Corresponding input terminals in a first set for each of the multiplexers 124, 126 are coupled to each other and to a row decoder 130, which, as mentioned above, receives a row address, typically from a memory controller (not shown). Input terminals in a second set for each of the multiplexers 124, 126 are coupled to ground. The multiplexer 124 couples the row lines for the first array 116 to either the row decoder 130 or to ground depending on the state of a control bit applied to a control terminal C of the multiplexer 124. In the same manner, the multiplexer 126 couples the row lines for the second array 118 to either the row decoder 130 or to ground depending on the state of a control bit applied to a control terminal C of the multiplexer 126.

The multiplexers 124, 126 are controlled by a control circuit 136, which receives an active page select ("APS") signal and a control bit from a mode register 138. As is well known in the art, mode registers are commonly used to control the operation of DRAMs. The mode register 138 is programmed to store a control bit corresponding by coupling an appropriate control signal to the DRAM 100 to place it in a programming mode prior to the start of normal operation of the DRAM 100, and then coupling a bank address bit BA0 to the mode register 138. The mode register 138 stores a logic "0" to indicate that DRAM 100 has been programmed to operate in the high-power, full page size mode, and stores a logic "1" to indicate that the DRAM 100 has been programmed to operate in the low-power, reduced page size mode.

The control bit from the mode register 138 is coupled to first and second NAND gates 140, 142, which have outputs coupled to the respective multiplexers 124, 126 thorough respective inverters 146, 148. The NAND gate 140 receives the APS signal, while the NAND gate 142 receives the compliment of the APS signal through an inverter 150. Thus, when the mode register 138 outputs a logic "0" indicative of operation in the high-power, full page size mode, the multiplexers 124, 126 couple their respective row lines to the output of the row decoder 130. When the mode register 138 outputs a logic "1" indicative of operation in the low-power, reduced page size mode, the multiplexers 124, 126 couple their respective row lines to either the output of the row decoder 130 or to ground depending on the state of the APS signal. When the APS signal is low in the low-power, reduced page size mode, the row lines of the first array 116 are coupled to the output of the row decoder 130, and the row lines of the second array 118 are coupled to ground. As a result, only the row lines in the first array 116 are activated responsive to row addresses decoded by the row decoder 130. Conversely, when the APS signal is high in the low-power, reduced page size mode, the row lines of the second array 118 are coupled to the output of the row decoder 130, and the row lines of the first array 116 are coupled to ground. As a result, only the row lines in the second array 118 are activated responsive to row addresses decoded by the row decoder 130. In the high-power, full page size mode when the control bit from the mode register 138 is low, the row lines of both the first array 116 and the second array 118 are coupled to the output of the row decoder 130. As a result, the row lines in both the first array 116 and the second array 118 are activated responsive to row addresses decoded by the row decoder 130.

As explained above, the column lines in the arrays 116, 118 are selected by column decoders and sense amplifiers 160, 162, which receive a column address, also typically from a memory controller (not shown in FIG. 2). Whenever a row line is activated, the sense amplifiers 160, 162 for the arrays 116, 118, respectively, sense the level of respective data bits in respective columns in whichever one or both of the arrays 116, 118 is active. As also mentioned above, when the sense amplifiers 160, 162 are sensing data bit levels, they consume a substantial amount of power. To limit the power consumption, the sense amplifiers 160, 162 can be selectively enabled by the APS signal. When the APS signal is low to allow row activate signals to be coupled to the row lines in the first array 116, the compliment of the APS signal can be applied to the sense amplifiers 160 through an inverter 166 to enable the sense amplifiers 160 coupled to the first array 116. Similarly, when the APS signal is high to allow row activate signals to be coupled to the row lines in the second array 118, the APS signal can be applied to the sense amplifiers 162 to enable the sense amplifiers 160 coupled to the second array 118. However, it should be understood that it is not necessary to selectively enable the sense amplifiers 160, 162 to operate in a low-power, reduced page size mode. Even if the sense amplifiers remained enabled, they would draw negligible power as long as the row lines in the array 116, 118 to which they are coupled are not activated. Thus, for example, when the row lines for the first array 116 are coupled to ground as explained above, and row activate signals are being applied to the row lines in the second array 118, the sense amplifiers 160 will not sense any differential voltage levels, and they will therefore draw very little power. Thus, using the APS signal to selectively enable the sense amplifiers 160, 162 is optional.

As previously explained, in normal operation of the DRAM 100, either the first array 116 or second arrays 118 is selected by the $A_{12}$ bit of the column address. Thus, the $A_{12}$ column address bit could theoretically be used to control the state of the APS signal. If the $A_{12}$ bit was low, the APS signal would be low so that row activate signals corresponding to a row address are coupled to the first array 116. If the $A_{12}$ bit was high, the APS signal would be high so that row activate signals corresponding to a row address are coupled to the second array 118. However, the row activate signals must be coupled to the row lines in the arrays 116, 118 when the row address is being applied to the DRAM 100. Unfortunately, the row address is applied to the DRAM 100 before the column address is applied to the DRAM 100 so the $A_{12}$ column address bit is not present in the DRAM 100 when a row address is being decoded to activate a row line. Thus, the $A_{12}$ column address bit cannot be used to control the state of the APS signal.

Although several techniques can be used to generate the APS signal, according to one embodiment, the memory controller (not shown in FIG. 2) generates an $A_{13}$ row address bit from the $A_{12}$ column address bit, and applies the $A_{13}$ row address bit to the DRAM 100 when the $A_0$–$A_{12}$ row address bits are being applied to the DRAM 100. The A13 row address bit may be coupled to the DRAM using an external terminal that is either not used or not used during the time that the row address is being applied to the DRAM 100. Of course, other techniques for generating the APS signal may be used.

Figure 3:
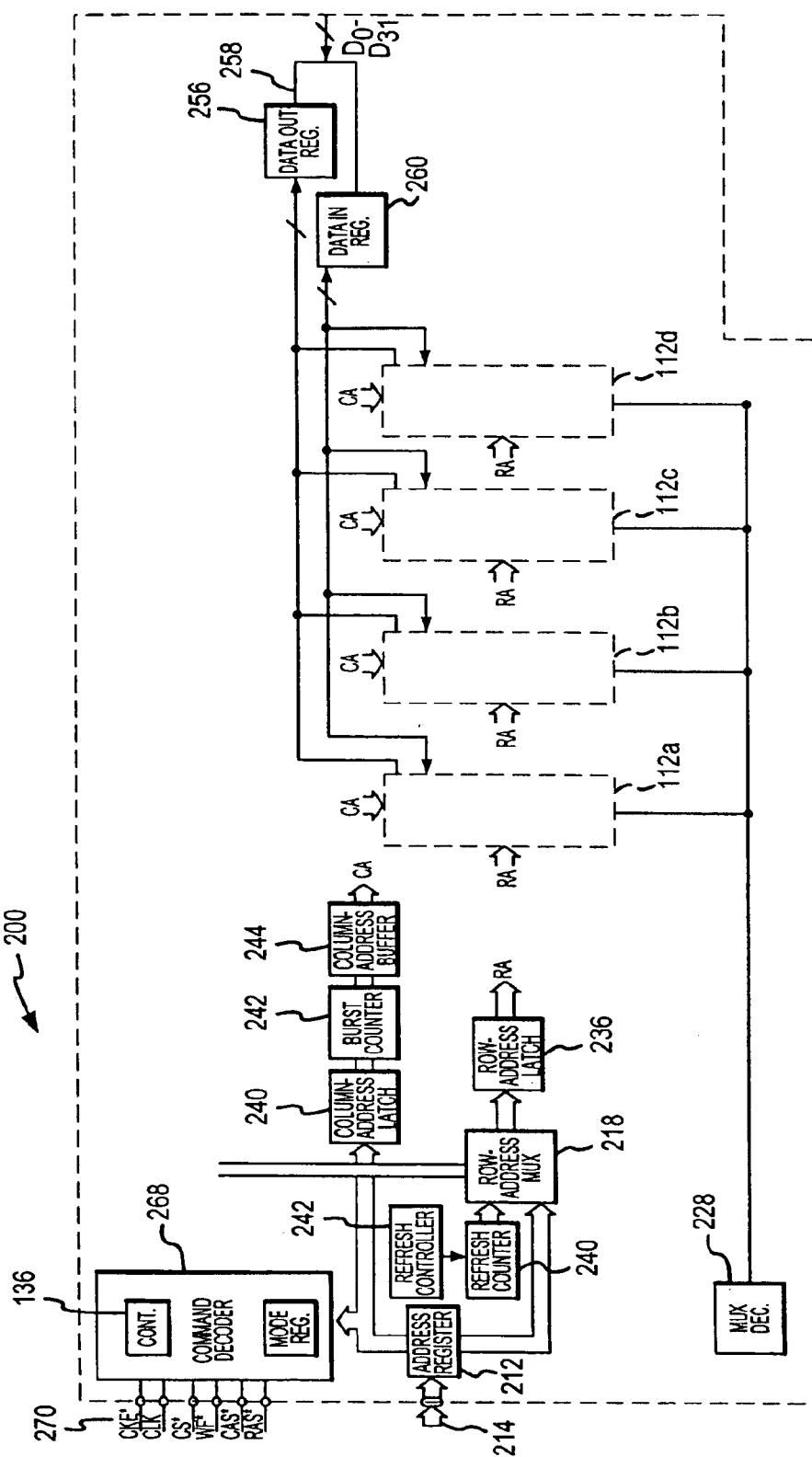
FIG. 3 is a block diagram of a DRAM including the portion of the DRAM shown in FIG. 2.

The portion of the DRAM 100 shown in FIG. 2 is shown as part of the complete DRAM 200 in FIG. 3. The DRAM 200 is a synchronous dynamic random access memory ("SDRAM") that includes an address register 212 adapted to receive row addresses and column addresses through an address bus 214. The address bus 214 is generally coupled to a memory controller (not shown in FIG. 3). A row address is initially received by the address register 212 and applied to a row address multiplexer 218. The row address multiplexer 218 couples the row address to a number of components associated with any of four memory banks 112a,b,c,d depending upon the state of two bank address bits applied to a bank decoder 228. One of the bank address bits is also applied to the mode register 138, which is normally contained in a command decoder 268. The command decoder 268 controls the operation of the DRAM 200 responsive to high level command signals received on a control bus 270. These high level command signals, which are typically generated by the memory controller, are a clock enable signal CKE*, a clock signal CLK, a chip select signal CS*, a write enable signal WE*, a row address strobe signal RAS*, and a column address strobe signal CAS*, where the "*" designates the signal as active low. The command decoder 268 generates a sequence of command signals responsive to the high level command signals to carry out a function (e.g., a read or a write) designated by each of the high level command signals. These command signals, and the manner in which they accomplish their respective functions, are conventional. Therefore, in the interest of brevity, a further explanation of these control signals will be omitted.

The row address multiplexer 218 couples row addresses to a row address latch 236, which stores the row address. Row addresses may also be generated for the purpose of refreshing the memory cells in the memory banks 112a,b,c,d. The row addresses are generated for refresh purposes by a refresh counter 240 that is controlled by a refresh controller 242.

As explained above, an $A_{13}$ row address bit is also applied to the DRAM along with the $A_0$–$A_{12}$ row address bits. The row address bit is coupled to the control circuit 136, which may also be in the command decoder 268. The control circuit 136 then generates control signals, as explained above, to control the operation of the multiplexers 124, 126, which are coupled between the row decoders 130 and respective arrays 116, 118 in each of the memory banks 112a,b,c,d.

After the row address $A_0$–$A_{12}$ and the extra row address bit $A_{13}$ have been applied to the address register 212 and stored in the row address latch 236, a column address is applied to the address register 212. The address register 212 couples the column address to a column address latch 240. Depending on the operating mode of the DRAM 10, the column address is either coupled through a burst counter 242 to a column address buffer 244, or to the burst counter 242, which applies a sequence of column addresses to the column address buffer 244 starting at the column address output by the address register 212. In either case, the column address buffer 244 applies a column address to the column decoders and sense amplifiers 160, 162 (FIG. 2) for the memory banks 112a,b,c,d. Although not shown in FIG. 3, the APS signal may be coupled to selectively enable the sense amplifiers 160, 162 for the respective arrays 116, 118 in each of the memory banks 112a,b,c,d, as previously explained.

Data to be read from one of the memory banks 112a,b,c,d are coupled to an external data bus 258 through a read data path that includes a data output register 256. Data to be written to one of the memory banks 112a,b,c,d are coupled from the external data bus 258 through a write data path that includes a data input register 260. The data are then transferred to one of the memory banks 112a,b,c,d.

Figure 4:
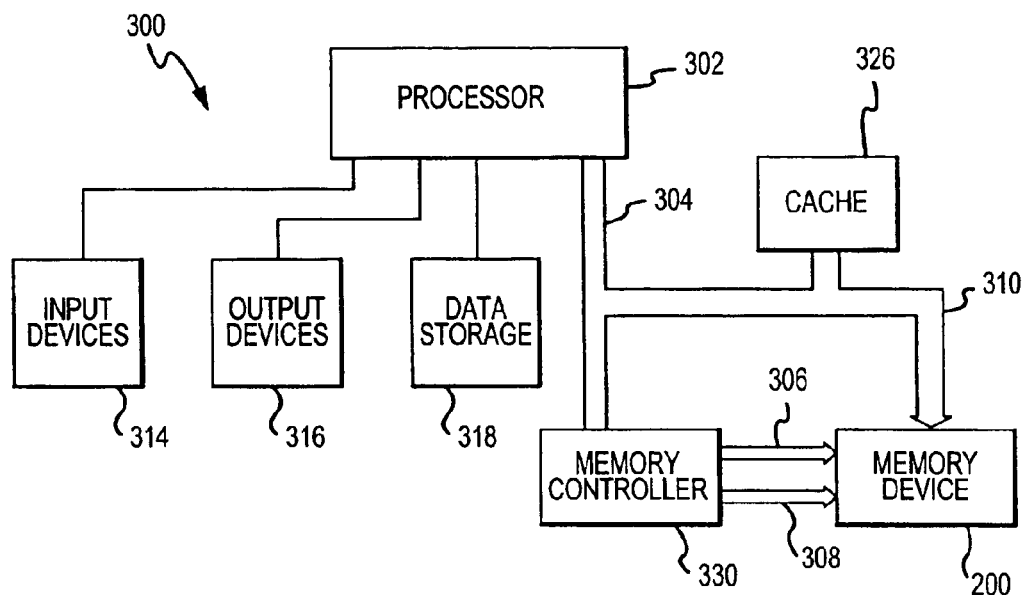
FIG. 4 is a block diagram of a computer system containing the DRAM of FIG. 3.

FIG. 4 is a block diagram illustrating a computer system 300 including the DRAM 200 of FIG. 3. The computer system 300 includes a processor 302 for performing various computing functions, such as executing specific software to perform specific calculations or tasks. The processor 302 includes a processor bus 304 that normally includes an address bus 306, a control bus 308, and a data bus 310. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to store data or retrieve data from external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM") and to the DRAM 200 through a memory controller 330. The memory controller 330 includes an address bus coupled to the address bus 214 (FIG. 3) to couple row addresses and column addresses to the DRAM 200. The memory controller 330 also couples the $A_{13}$ row address bit to the DRAM along with the $A_0$–$A_{12}$ row address bits. As previously explained, the $A_{13}$ row address bit corresponds to the $A_{12}$ column address bit that is subsequently applied to the DRAM 200. The memory controller 330 may apply the $A_{13}$ row address bit to the DRAM 200 through an external terminal that is either not active or not active when the memory controller 330 is not applying a row address to the DRAM 200.

The memory controller 330 also includes a control bus coupled to the control bus 270 of the DRAM 200. The external data bus 258 of the DRAM 200 is coupled to the data bus 310 of the processor 302, either directly or through the memory controller 330.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A computer system, comprising:
    a processor having a processor bus;
    an input device coupled to the processor through the processor bus adapted to allow data to be entered into the computer system;
    an output device coupled to the processor through the processor bus adapted to allow data to be output from the computer system;
    a memory controller generating a row address having a plurality of row address bits followed by a column address having a plurality of column address bits, the memory controller generating an array select signal having either a first state or a second state; and
    a memory device coupled to the memory controller, the memory device comprising:
        a row decoder coupled to the memory controller to receive the row address, the row decoder generating a row activate signal at one of a plurality of output terminals corresponding to the row address;
        a column decoder coupled to the memory controller to receive the column address, the column decoder generating a column activate signal at one of a plurality of output terminals corresponding to the column address; and
        first and second arrays of memory cells operable to store data written to or read from the array at a location determined by the row address and the column address, each of the first and second arrays having a respective set of row lines;
        a data path circuit operable to couple data signals corresponding to the data between the first and second arrays and an external data terminal;
        a command signal generator operable to generate a sequence of control signals corresponding to command signals applied to an external terminal;
        a mode select circuit' generating a mode select signal indicative of operation in either a first or a second mode; and
        a switching circuit coupled between the row decoder and the row lines of the first and second arrays, the switching circuit being operable to couple the output terminals of the row decoder to respective row lines of the first and second arrays responsive to the mode select signal indicating operation in the first mode, the switching circuit being operable to couple the output terminals of the row decoder to respective row lines of the first array but not to the row lines of the second array responsive to the mode select signal indicating operation in the second mode and the array select signal having the first state, and the switching circuit being operable to couple the output terminals of the row decoder to respective row lines of the second array but not to the row lines of the first array responsive to the mode select signal indicating operation in the second mode and the array select signal having the second state.

2. The computer system of claim 1 wherein the memory controller is operable to generate one of the column address bits as the array select signal.

3. The computer system of claim 2 wherein the memory controller is operable to couple the column address bit that is used as the array select signal to the memory device at the same time that the row address bits are coupled to the memory device.

4. The computer system of claim 2 wherein the memory controller is operable to generate a most significant column address bit as the array select signal.

5. The computer system of claim 1 wherein the mode select circuit comprises a mode register the may be programmed by an externally applied signal to store a bit corresponding to the mode select signal.

6. The computer system of claim 5 wherein the externally applied signal comprises a bank address bit.

7. The computer system of claim 1 wherein the memory controller is operable to generate the array select signal at the time the memory controller it operable to generate the row address bits.

8. The computer system of claim 1 wherein the switching circuit is further operable to couple the rows lines of the second array to a reference voltage responsive to the mode select signal indicating operation in the second mode and the array select signal having the first state, and being operable to couple the rows lines of the first array to a reference voltage responsive to the mode select signal indicating operation in the second mode and the array select signal having the second state.

9. The computer system of claim 8 wherein the reference voltage comprises ground potential.

10. The computer system of claim 1 wherein the switching circuit comprises:
    a control circuit receiving the mode select signal and the array select signal, the control circuit being operable to generate first and second control signals each having a first state responsive to the mode select signal indicating operation in the first mode, the control circuit being operable to generate the first control signal having the first state and the second control signal having a second state responsive to the mode select signal indicating operation in the second mode and the array select signal having the first state, and the control circuit being operable to generate the first control signal having the second state and the second control signal having the first state responsive to the mode select signal indicating operation in the second mode and the array select signal having the second state;

a first multiplexer having a first set of input terminals coupled to the output terminals of the row decoder, a second set of input terminals coupled to a first reference voltage, a set of output terminals coupled to respective row lines of the first array, and a control terminal coupled to receive the first control signal, the first multiplexer being operable to couple the output terminals to respective input terminals of the first set responsive to the first control signal having the first state, and being operable to couple the output terminals to respective input terminals of the second set responsive to the first control signal having the second state; and a second multiplexer having a first set of input terminals coupled to the output terminals of the row decoder, a second set of input terminals coupled to a second reference voltage, a set of output terminals coupled to respective row lines of the second array, and a control terminal coupled to receive the second control signal, the second multiplexer being operable to couple the output terminals to respective input terminals of the first set responsive to the second control signal having the first state, and being operable to couple the output terminals to respective input terminals of the second set responsive to the second control signal having the second state.

11. The computer system of claim 10 wherein the first and second reference voltages comprise ground potential.

12. The computer system of claim 1, further comprising:

a first set of sense amplifiers coupled to respective digit lines in the first array, the sense amplifiers in the first set having an enable terminal receiving a first enable signal having first and second states, power being coupled to the sense amplifiers in the first set responsive to the first enable signal having the first state, and power being decoupled from the sense amplifiers in the first set responsive to the first enable signal having the second state;

a second set of sense amplifiers coupled to respective digit lines in the second array, the sense amplifiers in the second set having an enable terminal receiving a second enable signal having first and second states, power being coupled to the sense amplifiers in the second set responsive to the second enable signal having the first state, and power being decoupled from the sense amplifiers in the second set responsive to the second enable signal having the second state; and a control circuit receiving the mode select signal and the array select signal, the control circuit being operable to generate first and second enable signals each having the first state responsive to the mode select signal indicating operation in the first mode, the control circuit being operable to generate the first enable signal having the first state and the second enable signal having the second state responsive to the mode select signal indicating operation in the second mode and the array select signal having the first state, and the control circuit being operable to generate the first enable signal having the second state and the second enable signal having the first state responsive to the mode select signal indicating operation in the second mode and the array select signal having the second state.

13. The computer system of claim 1 wherein the memory device comprises a dynamic random access memory.

14. The computer system of claim 1 wherein the memory device comprises a plurality of memory banks each of which includes first and second arrays and a respective switching circuit coupled to the first and second arrays of each memory bank.

15. The computer system of claim 1 wherein the memory controller is operable to generate the array select signal at the same time that the memory controller generates the row address having a plurality of row address bits.

16. The computer system of claim 1 wherein the first and second arrays of memory cells comprise dynamic random accesses memory cells.

17. In a memory device, a method of addressing an array of memory cells arranged in rows and column, the method comprising:

determining within the memory device whether the memory device is to operate in either a first mode or a second mode;

receiving a row address having a first plurality of row address bits and a column address having a second plurality of column address bits;

using the row address bits to open a row of memory cells in the memory array responsive to determining that the memory device is to operate in the first mode;

using the column address bits to select a memory cell in the open row after determining that the memory device is to operate in the first mode;

using one of the column address bits to select memory cells in either a first set of columns or a second set of columns after determining that the memory device is to operate in the second mode;

using the row address bits to open a row of memory cells in the selected memory cells after determining that the memory device is to operate in the second mode; and using the column address bits to select a memory cell in the open row after determining that the memory device is to operate in the second mode.

18. The method of claim 17 wherein the act of using one of the column address bits to select memory cells in either a first set of columns or a second set of columns after determining that the memory device is to operate in the second mode comprises using a most significant one of the column address bits to select memory cells in either a first set of columns or a second set of columns after determining that the memory device is to operate in the second mode.

19. The method of claim 18 wherein the act of using the column address bits to select a memory cell in the open row after determining that the memory device is to operate in the second mode comprises using all but the most significant bit of the column address bits to select a memory cell in the open row after determining that the memory device is to operate in the second mode.

20. The method of claim 17 wherein the act of determining within the memory device whether the memory device is to operate in either a first mode or a second mode comprises:

programming a mode register to either a first state or a second state prior to normal operation of the memory device;

examining the mode register during normal operation of the memory device to determine the programmed state of the mode register;

determining that the memory device is to operate in the first mode if the mode register has been determined to be programmed in the first state; and determining that the memory device is to operate in the second mode if the mode register has been determined to be programmed in the second state.

21. The method of claim 20 wherein the act of programming the mode register to either the first state or the second state comprises:
externally applying a bank address bit to the mode register; and
storing the externally applied bank address bit in the mode register.

22. The method of claim 17, further comprising:
applying power to sense amplifiers coupled to the first set of columns responsive to either determining within the memory device that the memory device is to operate in the first mode or receiving the column address bit selecting the memory cells in the first set of columns after determining that the memory device is to operate m the second mode;
applying power to sense amplifiers coupled to the second set of columns responsive to either determining within the memory device that the memory device is to operate in the first mode or receiving the column address bit selecting the memory cells in the second set of columns after determining that the memory device is to operate in the second mode;
removing power from the sense amplifiers coupled to the first set of columns responsive to receiving the column address bit selecting the memory cells in the second set of columns after determining that the memory device is to operate in the second mode; and
removing power from the sense amplifiers coupled to the second set of columns responsive to receiving the column address bit selecting the memory cells in the first set of columns after determining that the memory device is to operate in the second mode.

23. A method of coupling row and column address signals to a memory device, comprising:
in a first mode, coupling M row address signals to the memory device to select one of $2^M$ rows of memory cells in the memory device;
in the first mode, coupling N column address signals to the memory device to select a memory cell in one of $2^N$ columns of memory cells in the selected row;
in a second mode, coupling M+1 row address signals to the memory device to select one of two sets of columns of memory cells in the memory device and one of $2^M$ rows of memory cells in the selected set of columns; and
in the second mode, coupling N−1 columns of memory cells to the memory device to select a memory cell in one of the $2^{N-1}$ columns of memory cells in the selected row and selected set of columns.

24. The method of claim 23 wherein the act of coupling M+1 row address signals to the memory device comprises simultaneously coupling the M+1 row address signals to the memory device.

25. A method of selecting a memory cell in an array of memory cells of a memory device, the method comprising:
in a first mode, selecting one of $2^M$ rows of memory cells in the memory device;
in the first mode, selecting a memory cell in one of $2^N$ columns of memory cells in the selected row;
in a second mode, selecting one of two sets of columns of memory cells in the memory device and one of $2^M$ rows of memory cells in the selected set of columns; and
in the second mode, selecting a memory cell in one of the $2^{N-1}$ columns of memory cells in the selected row and selected set of columns.

26. The method of claim 25 further comprising determining within the memory device whether the memory device is operating in the first mode or the second mode.

27. The method of claim 26 wherein the act of determining within the memory device whether the memory device is to operate in either the first mode or the second mode comprises:
programming a mode resister to either a first state or a second state prior to normal operation of the memory device;
examining the mode register during normal operation of the memory device to determine the programmed state of the mode register;
determining that the memory device is to operate in the first mode if the mode register has been determined to be programmed in the first state; and
determining that the memory device is to operate in the second mode if the mode register has been determined to be programmed in the second state.

28. The method of claim 27 wherein the act of programming the mode register to either the first state or the second state comprises:
externally applying a bank address bit to the mode register; and
storing the externally applied bank address bit in the mode register.

29. The method of claim 28, further comprising:
applying power to sense amplifiers coupled to the memory cells in the first and second sets of columns of memory cells in the first operating mode;
applying power to sense amplifiers coupled to the memory cells in the first set of columns of memory cells and removing power to sense amplifiers coupled to the memory cells in the second set of columns of memory cells if the first set of columns is selected in the second operating mode; and
applying power to sense amplifiers coupled to the memory cells in the second set of columns of memory cells and removing power to sense amplifiers coupled to the memory cells in the first set of columns of memory cells if the second set of columns is selected in the second operating mode.

30. A method of operating a memory device having an array of memory cells arranged in $2^M$ rows and $2^N$ columns, the method comprising:
in a first operating mode, addressing the memory device as a single $2^M \times 2^N$ array of memory cells; and
in a second operating mode, addressing the memory device as two separate $2^M \times 2^{N/2}$ arrays of memory cells.

31. The method of claim 30 wherein the act of addressing the memory device as a single $2^M \times 2^N$ array of memory cells in the first operating mode comprises:
coupling M row address bits and N column address bits to the memory device;
using the M row address bits to open one of $2^M$ rows of memory cells in the array; and
using the N column address bits to select a memory cell in one of $2^N$ columns of memory cells in the open row.

32. The method of claim 31 wherein the act of addressing the memory device as two separate $2^M \times 2^{N/2}$ arrays of memory cells in the second operating mode comprises:
coupling M row address bits and N column address bits to the memory device;
using the one of the column address bits to select one of two separate $2^M \times 2^{N/2}$ sets of memory cells
using the M row address bits to open one of $2^M$ rows of memory cells in the selected set of memory cells; and
using N−1 column address bits to select a memory cell in one of $2^{N/2}$ columns of memory cells in the open row.

* * * * *

UNITED STATES PATENT AND TRADEMARK OFFICE
CERTIFICATE OF CORRECTION

| | |
|---|---|
| PATENT NO. | : 6,965,540 B2 |
| APPLICATION NO. | : 10/851879 |
| DATED | : November 15, 2005 |
| INVENTOR(S) | : Todd D. Farrell and Scott E. Schaefer |

It is certified that error appears in the above-identified patent and that said Letters Patent is hereby corrected as shown below:

Column 1, Line 26 "For many application," --For many applications,--

Column 2, Line 19 "tends to increases with" --tends to increase with--

Column 2, Line 43 "to receive 12 column" --to receive 12 column--

Column 4, Line 15 "to store a control bit corresponding by coupling" --to store a corresponding control bit by coupling--

Column 4, Line 27 "thorough" --through--

Column 4, Line 30 "compliment" --complement--

Column 5, Line 4 "compliment" --complement--

Column 5, Line 47 "The A13" --The $A_{13}$--

Column 8, Line 4 "a mode select circuit' " --a mode select circuit--

Column 8, Line 37 "mode register the may be" --mode register that may be--

Column 8, Line 44 "controller it operable" --controller is operable--

Column 8, Lines 47 and 51 "couple the rows lines" --couple the row lines--

Column 10, Line 12 "accesses memory cells." --access memory cells.--

Column 10, Line 14 "arranged in rows and column, the method" --arranged in rows and columns, the method--

Column 11, Line 15 "m the second mode;" --in the second mode;--

Column 12, Line 61 "memory cells" --memory cells;--

UNITED STATES PATENT AND TRADEMARK OFFICE
CERTIFICATE OF CORRECTION

PATENT NO. : 6,965,540 B2
APPLICATION NO. : 10/851879
DATED : November 15, 2005
INVENTOR(S) : Todd D. Farrell and Scott E. Schaefer It is certified that error appears in the above-identified patent and that said Letters Patent is hereby corrected as shown below:

Column 12, Line 65 "one of $2^{N/2}$" --one of $2^{N-1}$--

Signed and Sealed this

Thirteenth Day of November, 2007

JON W. DUDAS
*Director of the United States Patent and Trademark Office*